(12) United States Patent  
Schubert

(10) Patent No.: US 8,928,301 B2  
(45) Date of Patent: Jan. 6, 2015

(54) PULSE WIDTH MODULATION BASED CONTROLLER

(75) Inventor: Andreas Schubert, Dresden (DE)

(73) Assignee: Atmel Corporation, San Jose, CA (US)

( * ) Notice: Subject to any disclaimer, the term of this patent is extended or adjusted under 35 U.S.C. 154(b) by 290 days.

(21) Appl. No.: 13/495,696

(22) Filed: Jun. 13, 2012

(65) Prior Publication Data

US 2013/0335049 A1    Dec. 19, 2013

(51) Int. Cl.  
*H02M 3/157*    (2006.01)

(52) U.S. Cl.  
USPC .......................................... 323/283; 323/223

(58) Field of Classification Search  
CPC ....................... H02M 3/157; H02M 2001/0012  
USPC .................................................. 323/283, 223  
See application file for complete search history.

(56) References Cited

U.S. PATENT DOCUMENTS

| 2012/0081093 A1* | 4/2012 | Hidaka | 323/283 |
| 2013/0043852 A1* | 2/2013 | Marsili et al. | 323/283 |

OTHER PUBLICATIONS

Delta-sigma modulation. http://en.wikipedia.org/wiki/Delta-sigma_modulation [Apr. 25, 2012].  
Pulse-width modulation. http://en.wikipedia.org/wiki/Pulse-width_modulation [Apr. 25, 2012].  
Borghi, M.R., "Switching Regulators", Smart Power ICs Technologies and Applications, Chapter 7, pp. 286-339, New York (1995).  
Paul et al., Sigma-Delta Modulated Digitally Controlled Non-Inverting Buck-Boost Converter for WCDMA RF Power Amplifiers, IEEE pp. 533-539 (2009).  
Keskar, N., "High-Bandwidth, Wide LC-Resr Compliant Sigma-Delta Boost DC-DC Switching Converters", A thesis presented to the Academic Faculty, GA Institute of Technology, May 2008.

* cited by examiner

*Primary Examiner* — Harry Behm  
*Assistant Examiner* — Matthew Grubb  
(74) *Attorney, Agent, or Firm* — Fish & Richardson P.C.

(57) ABSTRACT

A control circuit adjusts the duty cycle of a PWM control signal. An analog processing component within the control circuit receives an analog feedback input signal and compares it to an analog reference signal to generate a pre-processed signal. A sigma-delta modulator within the analog processing component generates a quantized signal based on the pre-processed signal. A digital processing component stores a value. The controller then adjusts the duty cycle of the PWM signal to correspond to the value. A clock keeps the system synchronized.

30 Claims, 8 Drawing Sheets

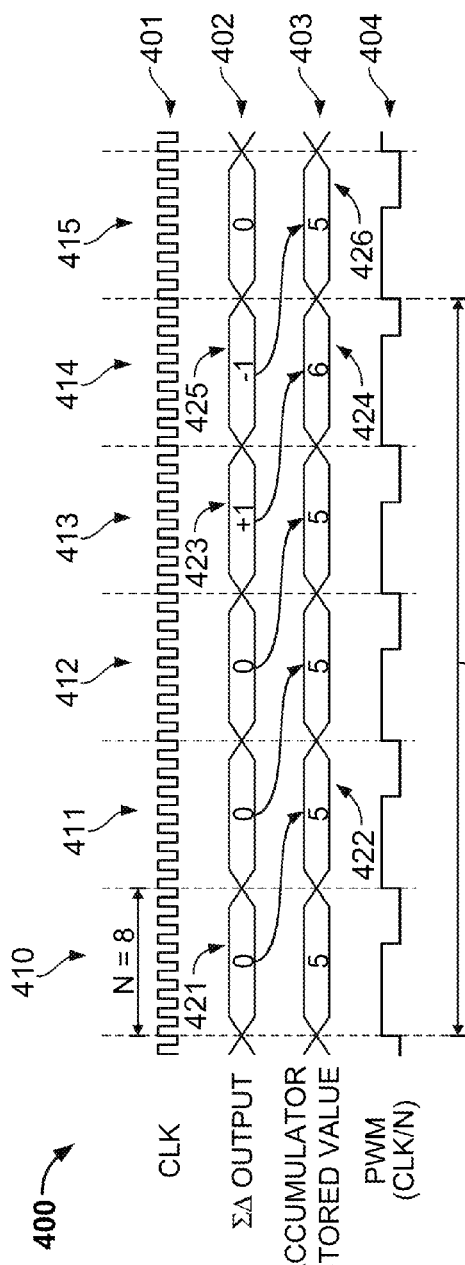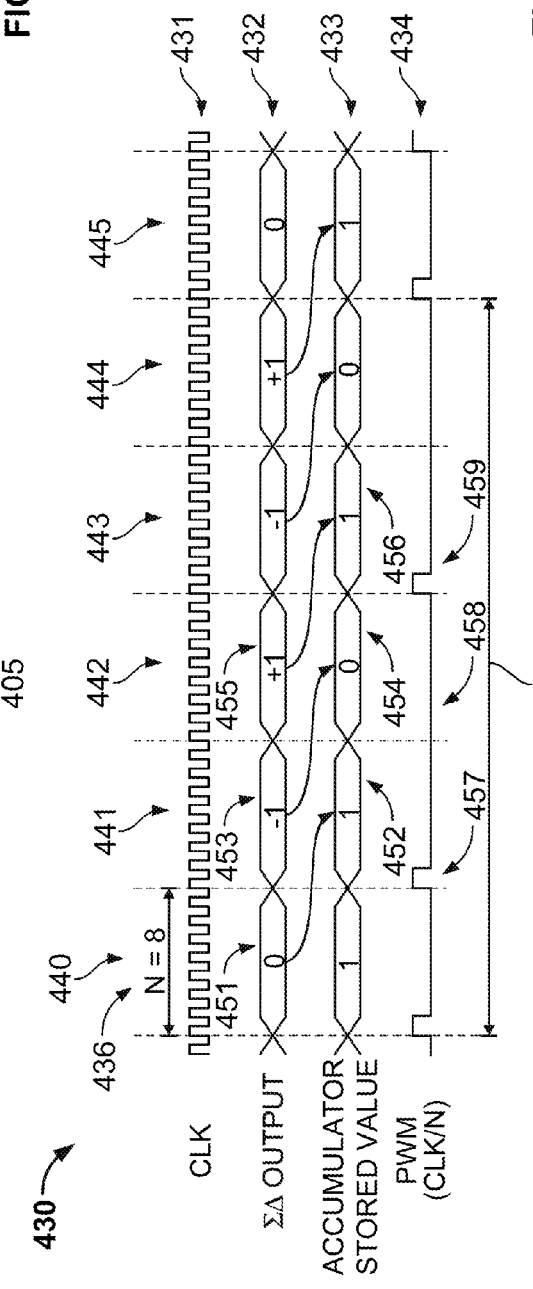

PULSE WIDTH MODULATION BASED CONTROLLER

TECHNICAL FIELD

This disclosure relates generally to electronics and more particularly to control circuits that generate pulse width modulated (PWM) signals.

BACKGROUND

Control circuits can use pulse width modulated (PWM) signals to control other electronic circuits. Feedback systems can include such control circuits to adjust various characteristics of a PWM signal, for example, to adjust the duty cycle of the PWM signal. Such control circuits are useful, for example, in power converter circuits such as DC-DC boost converters that use rapid switching of a transistor controlled by a PWM signal.

Some conventional control circuits compare a saw tooth signal to an output signal and adjust the duty cycle of a PWM control signal based on the comparison. Some conventional systems vary the duty cycle of a PWM control signal varying the "on" time or the "off" time of the control signal. Some conventional systems use a microcontroller executing software as a control circuit; these systems can require an analog to digital converter (ADC).

SUMMARY

A control circuit adjusts the duty cycle of a PWM control signal. An analog processing component within the control circuit receives an analog feedback input signal and compares it to an analog reference signal to generate a pre-processed signal. A sigma-delta modulator within the analog processing component generates a quantized output signal based on the pre-processed signal. A digital processing component then uses a digital filter, e.g., an accumulator, to accumulate the quantized output signal and stores a value. The controller then adjusts the duty cycle of the PWM signal to correspond to the value store in the accumulator. A clock synchronizes the system.

Particular implementations of the control circuit can provide one or more of the following advantages: 1) the control circuit can operate with a latency of less than two clock cycles of the PWM signal from receiving a feedback input to adjusting the duty cycle of the PWM signal; 2) the control circuit can perform pulse skipping and period extension; 3) the operation frequency of the control circuit is synchronous to a system clock; 4) the frequency of the PWM signal can remain constant throughout the operation of the control circuit, resulting in predictable interference caused by the system; 5) a complete analog to digital converter (ADC) is not required for the control circuit, which can reduce cost, area, and latency of the control circuit; and 6) advanced digital filtering can be used to provide various system transfer functions for various applications, which can make pre-processing unnecessary.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 4A is an example waveform diagram of internal signals of the control circuit of FIG. 3.

FIG. 4B is an example waveform diagram of internal signals of the control circuit.

DETAILED DESCRIPTION

Example DC-DC Boost Converter

Figure 1:
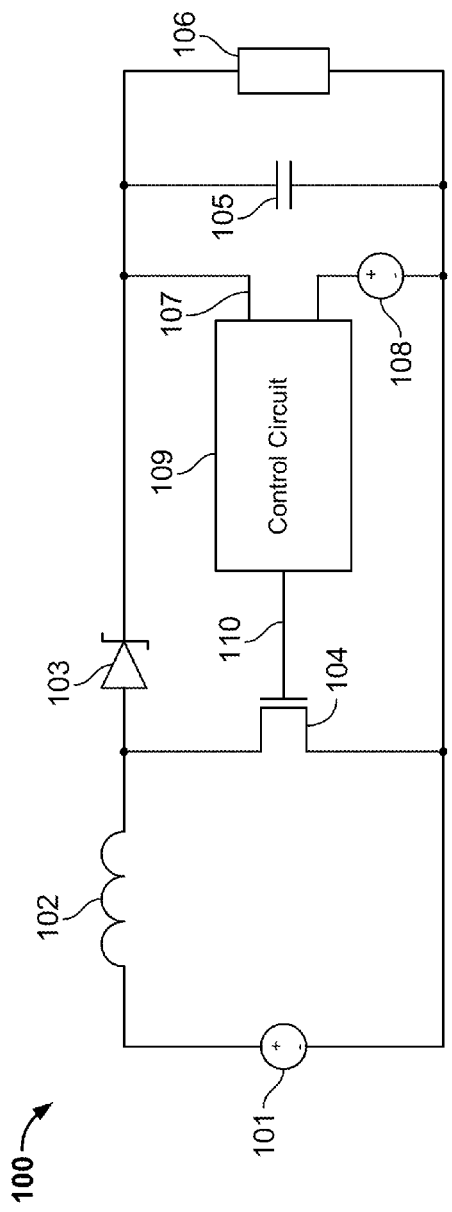
FIG. 1 shows a schematic diagram of an example DC-DC boost converter that includes a control circuit to generate a PWM signal.

FIG. 1 shows a schematic diagram of an example DC-DC boost converter 100 that includes a control circuit 109 to generate a PWM signal at an output 110. The control circuit 109 can be used in various circuits that generate PWM control signals. A voltage source 101 (for example, a battery) is coupled to an inductor 102. A diode 103 is coupled between the inductor 102 and an output load 106. A switch 104 (for example, a transistor), is controlled by the PWM signal from the control circuit. A reservoir capacitor 105 is coupled to the diode. The control circuit 109 includes a feedback input 107 and a second input coupled to a reference voltage source 108.

In operation, the example DC-DC boost converter provides a higher voltage output to the load than originally supplied by the voltage source 101. In this example, when the switch 104 is closed, energy flows from the voltage source 101, charges the inductor 102, and flows from the inductor through the closed switch 104. When the switch 104 is open, energy from the voltage source 101 and energy stored in the inductor 102 flows through the diode 103 to the output load 106, simultaneously charging reservoir capacitor 105. When the switch 104 closes again, the reservoir capacitor 105 supplies energy to the load. The DC-DC converter can be configured so that the switch 104 toggles at a minimum frequency such that the energy stored in the inductor 102 does not deplete or break down.

The control circuit 109 controls the switch 104 by the PWM signal at the output 110. Typically, the control circuit 109 is configured to provide a steady current to the load 106. The current provided to the load varies based on how long the switch 104 stays open and how long the switch 104 stays closed. Since the PWM signal generated by the control circuit 109 controls the state of switch 104, the opening and closing of the switch 104 corresponds to the duty cycle of the PWM signal output by the control circuit 109. The control circuit 109 compares the voltage at the feedback input 107 to the voltage at a reference input 108 to adjust the duty cycle of the generated PWM signal. A controller 109 regulates the duty cycle of the PWM signal.

Discontinuous Conduction Mode Operation (DCM)

Figure 2A:
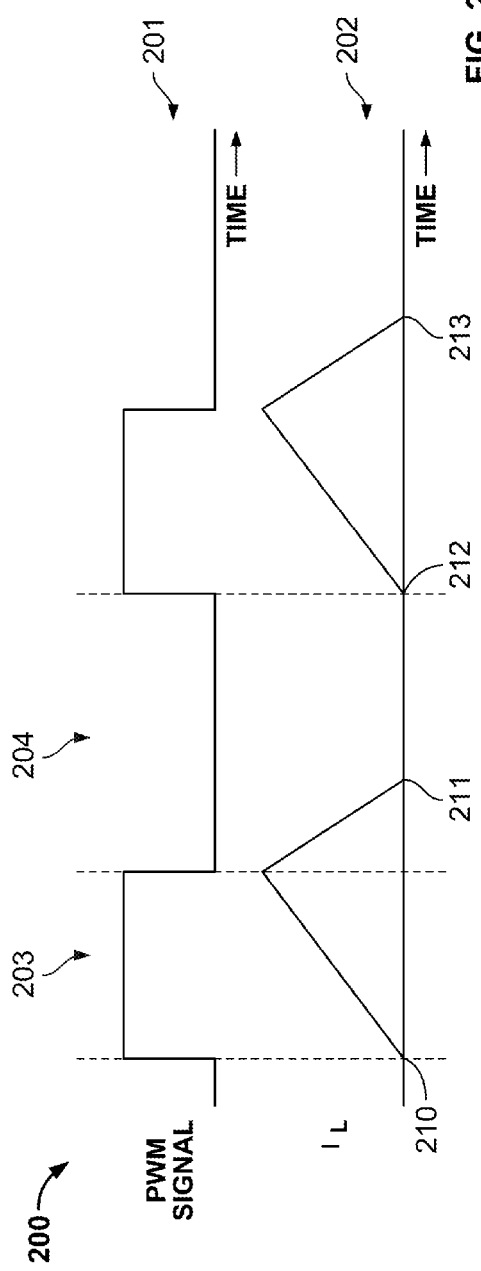
FIG. 2A is an example timing waveform diagram illustrating discontinuous conduction mode of operation of a DC-DC converter.

FIG. 2A is an example timing waveform diagram 200 illustrating discontinuous conduction mode of operation of a DC-DC converter. The timing waveform illustrates a PWM signal 201 (e.g., output by the control circuit 109 of FIG. 1) and an inductor current 202 (e.g., the current through the inductor 102 of FIG. 1). PWM signal 201 is high during a first interval 203 and low during a second interval 204. The current 202 flowing through the inductor 102 of FIG. 1 increases during time interval 203 and decreases during time interval 204 until the energy stored in the inductor is depleted. Time interval 204 lasts long enough for the energy to deplete. Beginning at time 210, the current 202 increases when the PWM signal 201 is high, and the current 202 decreases when the PWM signal 201 is low. At time 211, the current 202 becomes zero. At time 212, the current 202 starts to increase again while the PWM signal 201 is high, but again decreases to zero when the PWM signal 201 is low and depletes at time 213.

In DCM, the ideal steady state relationship between the output voltage supplied to the load 106 and the input voltage source 101 is:

$$\frac{V_{DD}}{V_{BAT}} = 1 + \frac{V_{BAT} D^2}{2 f_{PWM} L \bar{I}_{Ds}} \quad \text{(Equation 4)}$$

In Eq. 4, $V_{DD}$ denotes the output voltage supplied to the load 106, $V_{BAT}$ denotes the voltage source 101, L denotes the inductance of the inductor 102, D denotes the duty cycle of the PWM signal, and $\bar{I}_{Ds}$ denotes the average current flowing through the diode 103.

Continuous Conduction Mode Operation (CCM)

Figure 2B:
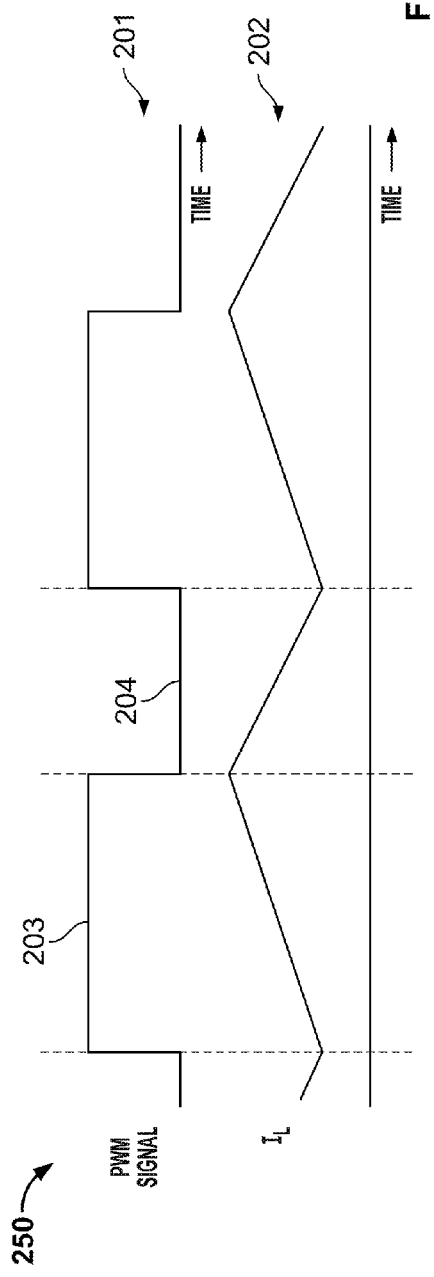
FIG. 2B is an example timing waveform diagram illustrating a continuous conduction mode of operation of a DC-DC converter.

FIG. 2B is an example timing waveform diagram 250 illustrating a continuous conduction mode of operation of a DC-DC converter. PWM signal 201 is high during a first interval 203 and low during a second interval 204. When the DC-DC converter is operating in the continuous conduction mode of operation, the current 202 flowing through the inductor 102 of FIG. 1 does not completely deplete. In FIG. 2B, the time interval 204 does not last long enough for the current to completely deplete before the PWM signal 201 goes high and the current 202 starts to charge up again.

In CCM, the ideal steady state relationship between the output voltage supplied to the load 106 and the input voltage source 101 is:

$$\frac{V_{DD}}{V_{BAT}} = \frac{1}{1-D} \quad \text{Equation 5}$$

Example Control Circuit

Figure 3:
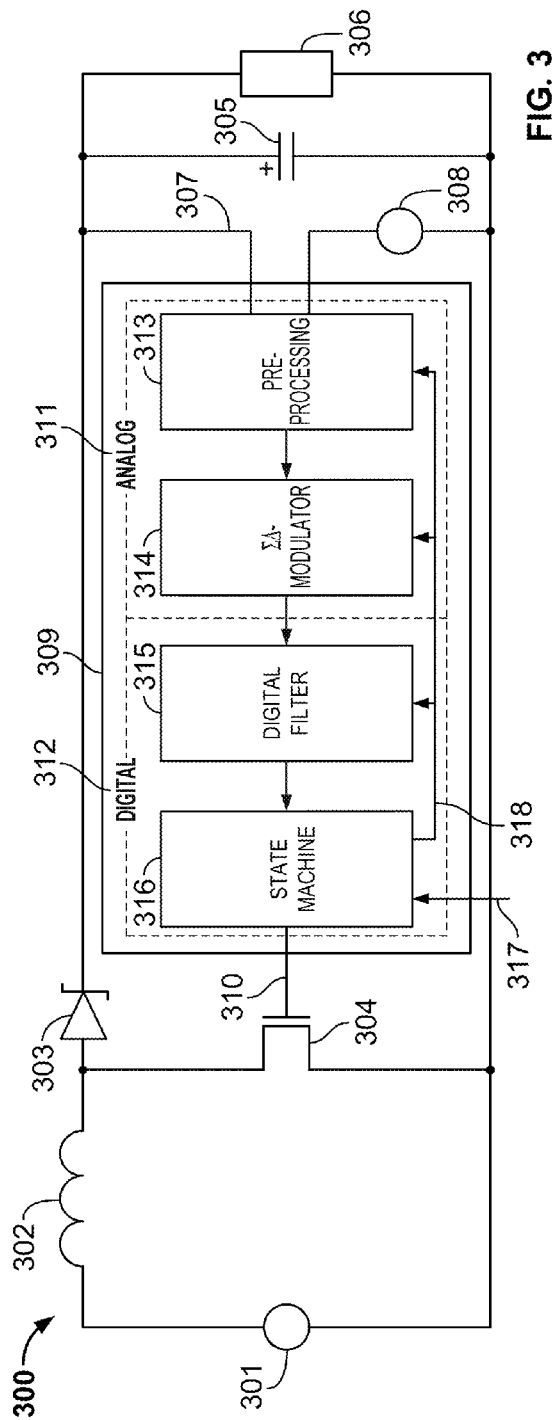
FIG. 3 is a block diagram of an example control circuit that can be used in DC-DC boost converter.

FIG. 3 is a block diagram of an example control circuit 309 that can be used in DC-DC boost converter 300. The voltage source 301, inductor 302, diode 303, switch 304, capacitor 305, load 306, feedback input 307, reference source 308, control circuit 309, and PWM signal output 310 can be implemented as described above with reference to FIG. 1.

The control circuit 309 comprises an analog processing component 311 and a digital processing component 312. The analog processing component comprises a pre-processor circuit 307 that receives the feedback input 307 and reference source 308. The analog processing component also comprises a sigma-delta modulator 314. Various sigma-delta modulators are known in the art, and the operation of the system does not depend on the implementation of the sigma-delta modulator. The digital processing component 312 comprises a digital filter 315, e.g., an accumulator, and a state machine 316. The state machine 316 can be a finite state machine that performs clock division and other control functions. The state machine 316 receives the clock signal characterized by a clock frequency via a clock input 317. The clock divider has an output 318 to synchronize the control circuit, and the clock divider also generates the PWM signal at output 310 with the duty cycle D.

The control circuit 309 modulates the duty cycle D of the PWM signal to obtain a stable control of the voltage output to the load 306 by transferring a certain amount of charge onto the reservoir capacitor 305. When the control circuit detects positive deviations of the output voltage to the load 306 from the reference voltage 308, the control circuit decreases the duty cycle D. When the control circuit detects negative deviations from of the output voltage to the load 306 from the reference voltage, the control circuit increases the duty cycle D.

Figure 4C:
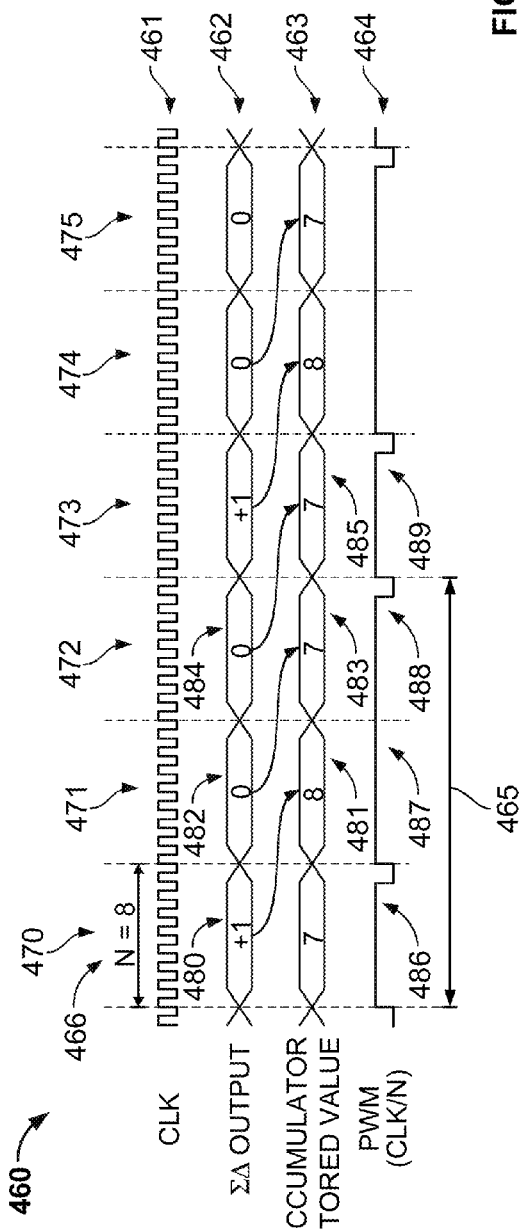
FIG. 4C shows an example waveform of internal signals of the control circuit.

The pre-processor circuit 313 measures the deviation of the output voltage to the load relative to the reference voltage to generate a pre-processed signal. An example pre-processor circuit 313 is described below with reference to FIG. 6. The sigma-delta modulator 314 converts this measurement into a modulated signal. A quantizer converts the modulated signal into a quantized output signal. The digital filter 315 can integrate the quantized output signal and store an accumulated value. The state machine 315 sets the duty cycle of the PWM signal 310 based on the accumulated value. The state machine 315 can divide the clock signal by a discreet divider ratio N of the different number of duty cycles D that it can generate. FIGS. 4A-C illustrate operation of the control circuit by waveform diagrams that illustrate internal signals of the control circuit.

Example of Internal Signals of the Control Circuit

FIG. 4A is an example waveform diagram 400 of internal signals of the control circuit 309 of FIG. 3. The diagram shows waveforms of the clock signal 401, the quantized output signal 402, the accumulated value 403, and the PWM signal 404. In this example, N=8 and the quantizer is a 3 value quantizer. The 3 value quantizer generates −1, 0, or 1 as a quantized output. The waveforms are divided into successive periods 410-415 of the PWM signal. In implementations where the system clock has a duty cycle of 0.5, the control circuit can be implemented where N has other values. For example, N can be chosen to be equal to either 4 or 3.5 and PWM duty cycles can be set in steps of 0.5/N.

Waveforms 403 and 402 show the effect of the quantized output signal 402 on the accumulated value 403 and PWM signal 404. When the quantized output signal 402 has a value of zero 421 during period 410, the accumulated value 403 during period 411 does not change and remains at five 422, so the control circuit maintains the PWM signal 404 at the same duty cycle D over periods 410 to 413.

When the quantized output signal 402 has a value of one 423 during the period 413, the accumulated value 403 in period 414 increases to six 424. Hence, the control circuit adjusts the duty cycle D of the PWM signal 404 during period 414 to have a higher duty cycle than the PWM signal 404 during period 413. When the quantized output signal 402 has a value of negative one 425 at 414, the accumulated value 404 at period 415 decreases to five 426. Hence, the control circuit adjusts the duty cycle D of the PWM signal 404 during period 415 to have a lower duty cycle than the PWM signal 404 during period 414. Over periods 410-414, the PWM signal 404 has an average duty cycle of 0.65. The duty cycle of the PWM signal in any given period of periods 410-414 is either 0.625 or 0.75.

Example of Pulse Skipping

FIG. 4B is an example waveform diagram 430 of internal signals of the control circuit. The diagram 430 illustrates a scenario where the control circuit performs pulse skipping.

In this example, the quantized output of zero 451 during period 440 causes the accumulated value to stay as a constant value of one 452 during period 441. The PWM signal 434 has the same duty cycle 457 over periods 440 and 441. During period 441, the quantized output signal 432 has a value of negative one 453, so the control circuit adjusts the accumulated value 433 during period 442 to become zero 454. Thus the duty cycle of the PWM signal 434 is zero as seen at 458. Pulse skipping refers to this event where the PWM signal 434 has a duty cycle of zero.

During period 442, the quantized output may become one 455 again, thus causing the accumulated value 433 to be one 456 and the duty cycle of the PWM signal 434 to become nonzero 459. Over periods 440-444 as shown by 435, the PWM signal 434 has an average duty cycle of 0.075 while the individual PWM signal 434 during each period 440-444 has a duty cycle of 0 or 0.125.

Example of Period Extension

FIG. 4C shows an example waveform of internal signals of the control circuit 460. Clock signal waveform 461, quantized output signal 462, accumulated value 433, PWM signal 464, and periods of PWM signals 470-475 correspond to 401-404 and 410-415, respectively. The value of N is eight 466.

In this example, the quantized output signal of one 480 during period 470 causes the accumulated value to increase to eight 481 during period 471. The PWM signal 463 has a duty cycle of one 487 during period 471. Period extension refers to this event where the PWM signal 464 has a duty cycle of one 487. During period 471, the quantized output signal of zero 482 would normally cause the accumulated value in period 472 to remain constant, but it decreases to seven 483. This occurs because in this example, the control circuit is configured to limit the maximum number of consecutive cycles that pulse period extension can be performed on a maximum of zero consecutive cycles. Since period extension occurs on 487 and 488 would be one consecutive cycle on which period extension would occur, the control circuit limits this, thus forcing the accumulated value down to seven 483. A control circuit can limit either period extension or pulse skipping in this manner with a different maximum consecutive number of consecutive cycles for either the period extension or the pulse skipping. The corresponding PWM signal 464 during period 472 has a duty cycle 488 of 0.875. The quantized output signal of zero 484 during period 472 properly causes the accumulated output to remain at seven during the next period 473, and the PWM signal to still have a duty cycle 489 of 0.875. Over periods 470 to 472 as shown by 463, the PWM signal 463 has an average duty cycle of 0.91667 while the individual PWM signal 464 during each period 470-472 has a duty cycle of 0.875 or 1.

Block Diagram of Control Circuit

Figure 5:
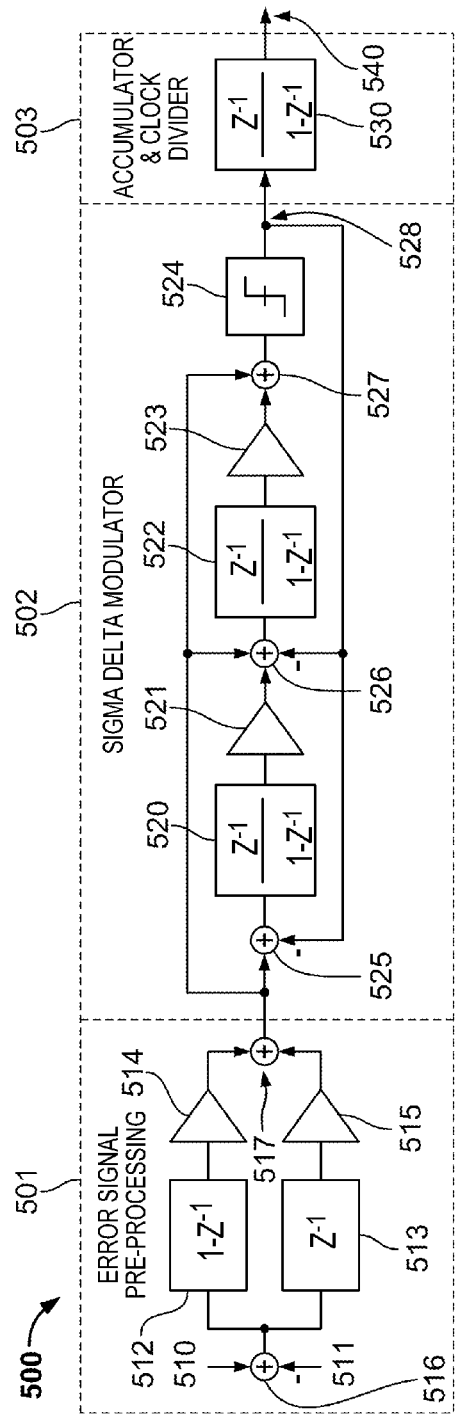
FIG. 5 is a block diagram of an example control circuit.

FIG. 5 is a block diagram of an example control circuit 500. The control circuit comprises three sections: an analog pre-processor circuit 501, a sigma-delta modulator 502, and an accumulator and clock divider 503.

The pre-processor circuit compares a feedback input 510 to a reference source 511 and measures for error, creating an error signal. A summation node 516 subtracts a reference signal at the reference source 511 from a feedback signal at the feedback input 510 to create a difference signal.

In some implementations, the control circuit includes a voltage divider in the feedback path. The voltage divider can be implemented with two resistors in a series connection from the output of the circuit coupled to a ground node. A node in the middle of the series connection provides a scaled down version of the output voltage. The scaled down voltage can be the signal that is compared and processed as described in the following paragraphs.

In a first branch of the pre-processor circuit, a differentiation block 512 determines the time derivative of the difference signal, and a multiplier 514 multiplies the derivative by a specified value, e.g., 150. In a second branch of the pre-processor circuit, a delay block 513 delays the difference signal, and a multiplier 515 multiplies the delayed signal by a specified value, e.g., 1. The specified values can be selected to stabilize the circuit. A summation node 517 adds the two signals from the multipliers to create an error signal.

The pre-processor circuit provides the error signal to the sigma-delta modulator, which generates a modulated signal. The control circuit can be implemented with various types of sigma-delta modulators. In some implementations, the sigma-delta modulator is implemented so that its signal transfer function imposes no delay. As shown, the sigma-delta modulator includes first, second, and third summation nodes 525, 526, and 527, first and second integrators 520 and 522, and first and second multipliers 521 and 523, e.g., that multiply their inputs by 0.5 and 2, respectively. The third summation node 527 provides the modulated signal to the quantizer 524 and feeds the quantized signal back into the first and second summation nodes 525 and 526.

The quantizer 524 quantizes the modulated signal to generate a quantized signal. The quantizer can be a 3-level quantizer, producing either a $-1$, a $0$, or a $1$. The quantizer provides the quantized signal to an input 528 of the accumulator 503. The accumulator includes an integration block 530, and the accumulator stores an accumulated value. The clock divider generates the PWM signal with a duty cycle based on the accumulated value.

Example Analog Pre-Processor Circuit

Figure 6:
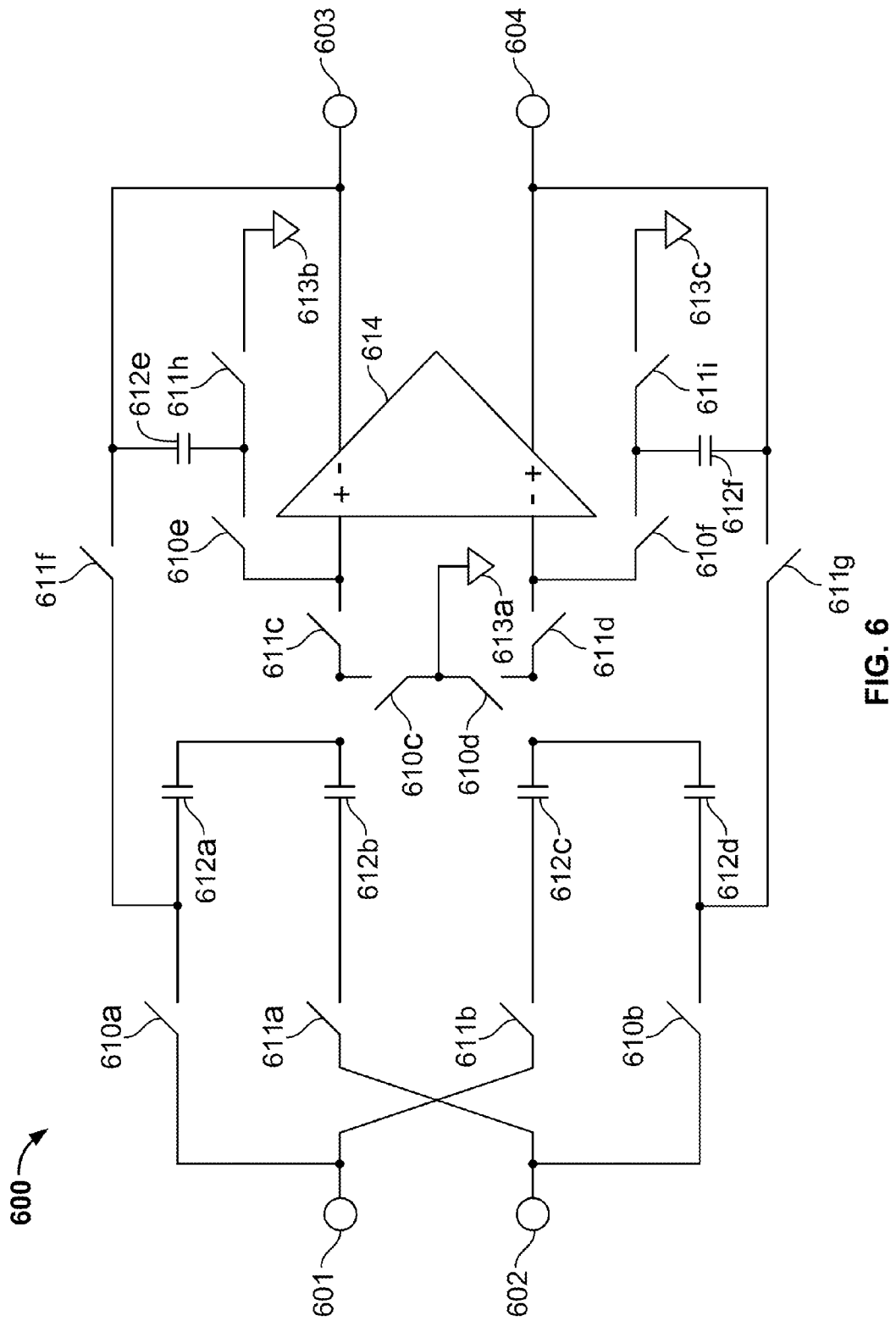
FIG. 6 is a schematic diagram of an example analog pre-processor circuit.

FIG. 6 is a schematic diagram of an example analog pre-processor circuit 600. The circuit includes input terminals 601 and 602 and output terminals 603 and 604. The circuit includes switches 610*a-f* and 611*a-i* to feed an input signal on the input terminals to the time delay and differentiation circuit components. Switches 610*a-f* open and close according to a first clock and switches 611*a-i* open and close according to a second non-overlapping clock. A clock divider can provide both the first and second clocks to guarantee the synchronous operation of the circuit. The clock divider can generate the first and second clocks so that the second clock can be considered a delayed first of the first clock, with both clocks having the same frequency. The delay of the second clock can be half of a period of that frequency. In some implementations, the duty cycle of the first and second clocks is 0.5 or near 0.5 to guarantee that switches 610a-f and switches 611a-i do not conduct at the same time. In this case, the frequency is the same frequency as the PWM signal.

The circuit includes capacitors 612a-e. The capacitors 612a-e can have different values to implement different values for multipliers of the circuit. For example, the capacitance of capacitors 612b-c determines the multiplication value for the time derivative of the difference signal, and the capacitance of capacitors 612a and 612c determines the multiplication value for the time delay of the difference signal.

The circuit includes an amplifier 614 and ground nodes 613a-c. The outputs of the amplifier are coupled to the pre-processor output terminals and coupled back into the circuit between switches 610a-b and 611a-b and capacitors 612a-d.

Example Sigma-Delta Integrator

Figure 7:
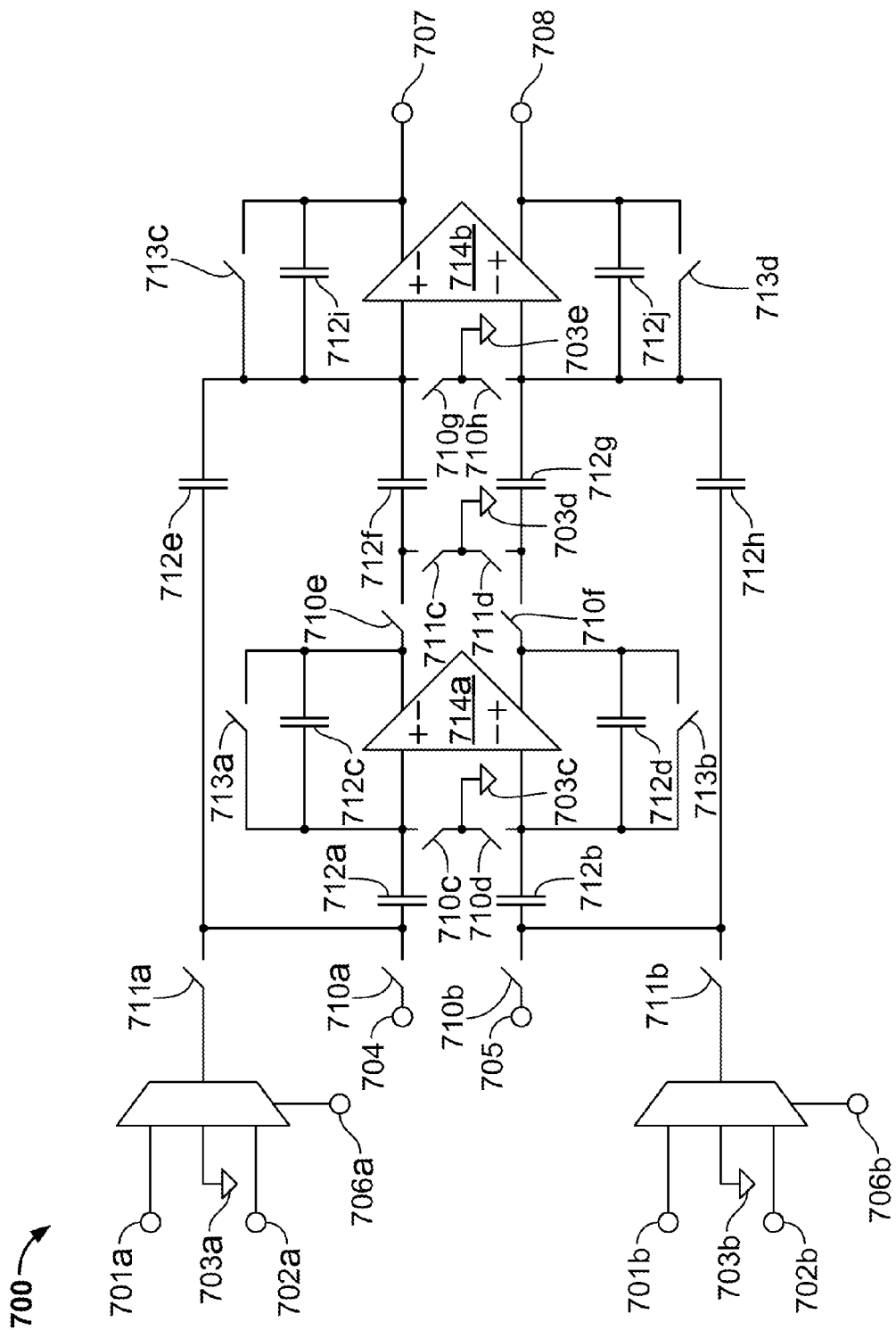
FIG. 7 is a schematic diagram of an example sigma-delta integrator circuit.

FIG. 7 is a schematic diagram of an example sigma-delta integrator circuit 700. The circuit includes inputs 704 and 705 for receiving a pre-processed signal. The circuit also includes inputs 701a-b and 702a-b for receiving a positive reference voltage, a negative reference voltage or a neutral voltage. The circuit includes ground nodes 703a-e that can provide the neutral voltage. The inputs 701a-b and 702a-b are coupled to input multiplexers controlled by control inputs 706a-b. The circuit includes outputs 707 and 708 for providing a modulated signal.

The circuit includes two amplifiers 714a-b to implement integrators. The circuit includes switches 710a-h and 711a-d. Switches 710a-h open and close according to a first clock and switches 711a-d open and close according to a second non-overlapping clock, e.g., as described above with reference to FIG. 6. The circuit also includes switches 713a-d that open and close according to a third clock. The third clock can be a reset clock to reset the circuit.

The circuit includes a network of capacitors 712a-j. The capacitors 712a-j can have different values to implement different values for multipliers of the circuit. For example, if capacitors 712i-j have a value C, then capacitors 712e-h and 712a-b can have a value of 2C, and capacitors 712c-d can have a value of 4C.

Example Three Level Quantizer

Figure 8:
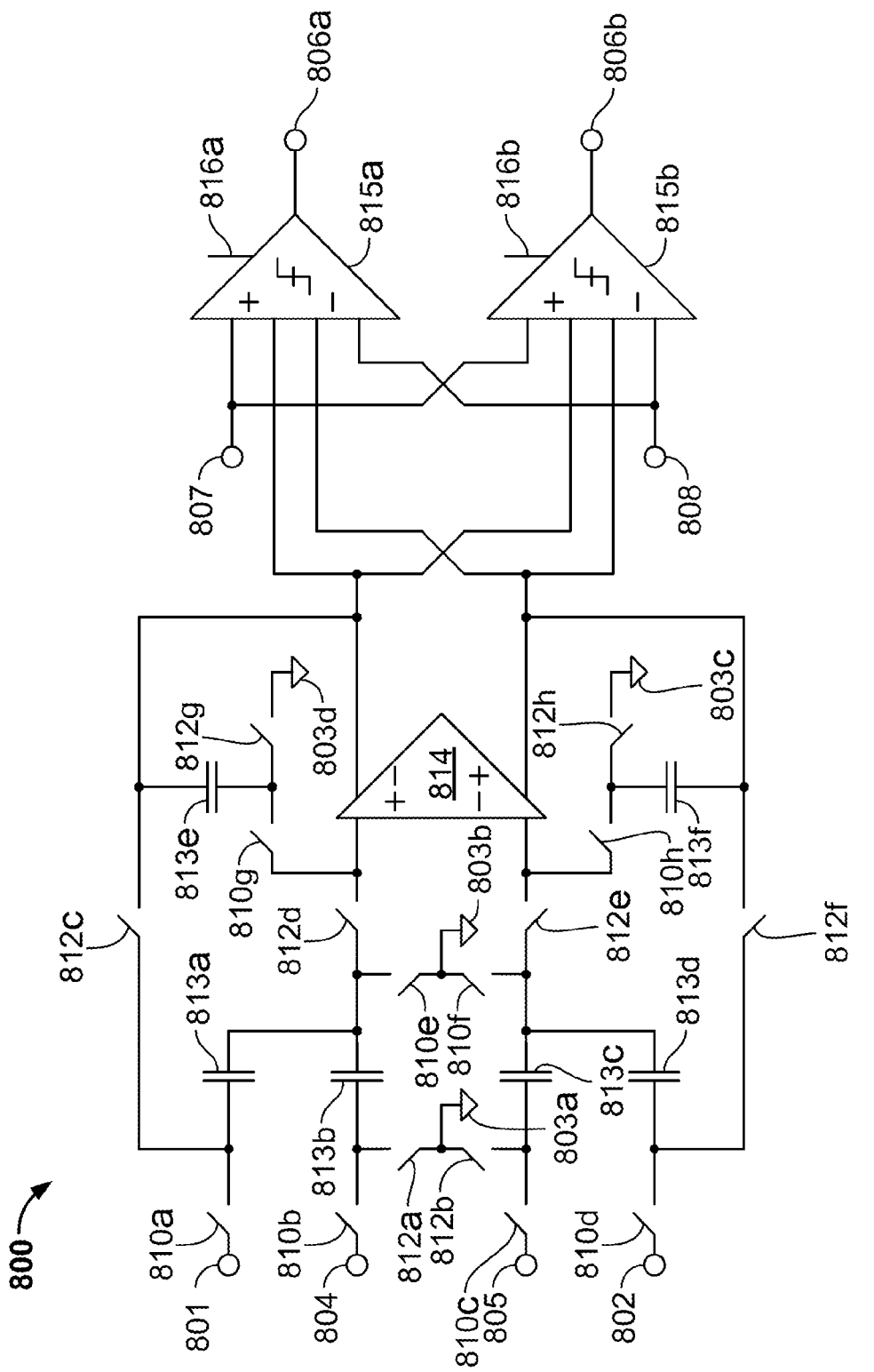
FIG. 8 is a schematic diagram of an example three level quantizer circuit.

FIG. 8 is a schematic diagram of an example three level quantizer circuit 800. The circuit includes inputs 801 and 802 to receive positive and negative reference voltages. The circuit includes inputs 804 and 805 to receive a modulated output signal from a sigma-delta modulator.

The circuit includes switches 810a-d that open and close according a first clock and switches 812a-g that open and close according to a second non-overlapping clock, e.g., as described above with reference to FIG. 6. The circuit includes ground nodes 803a-d.

The circuit includes a network of capacitors 813a-f. The capacitors 813a-f can have a same capacitance. The circuit includes an amplifier 814 and a network of capacitors 813a-f and comparators 815a-b to implement the summation of the differential output signal of the pre-processing circuit (nodes 804 and 805) and the differential output the integrators (nodes 807 and 808) and to implement quantization based on a comparison to the differential reference voltage (nodes 801 and 802). This circuit implements the functionality of summation node 527 and quantizer 524 as shown in FIG. 5. The nodes 815a-b receive on inputs 816a-b the system clock. The circuit includes outputs 806a-b that provide an output control signal. The outputs 806a-b can be coupled to the control inputs 706a-b of the sigma-delta modulator of FIG. 7. The circuit includes outputs 807 and 808 that provide a quantized output signal.

Example Control Circuit Flow Chart

Figure 9:
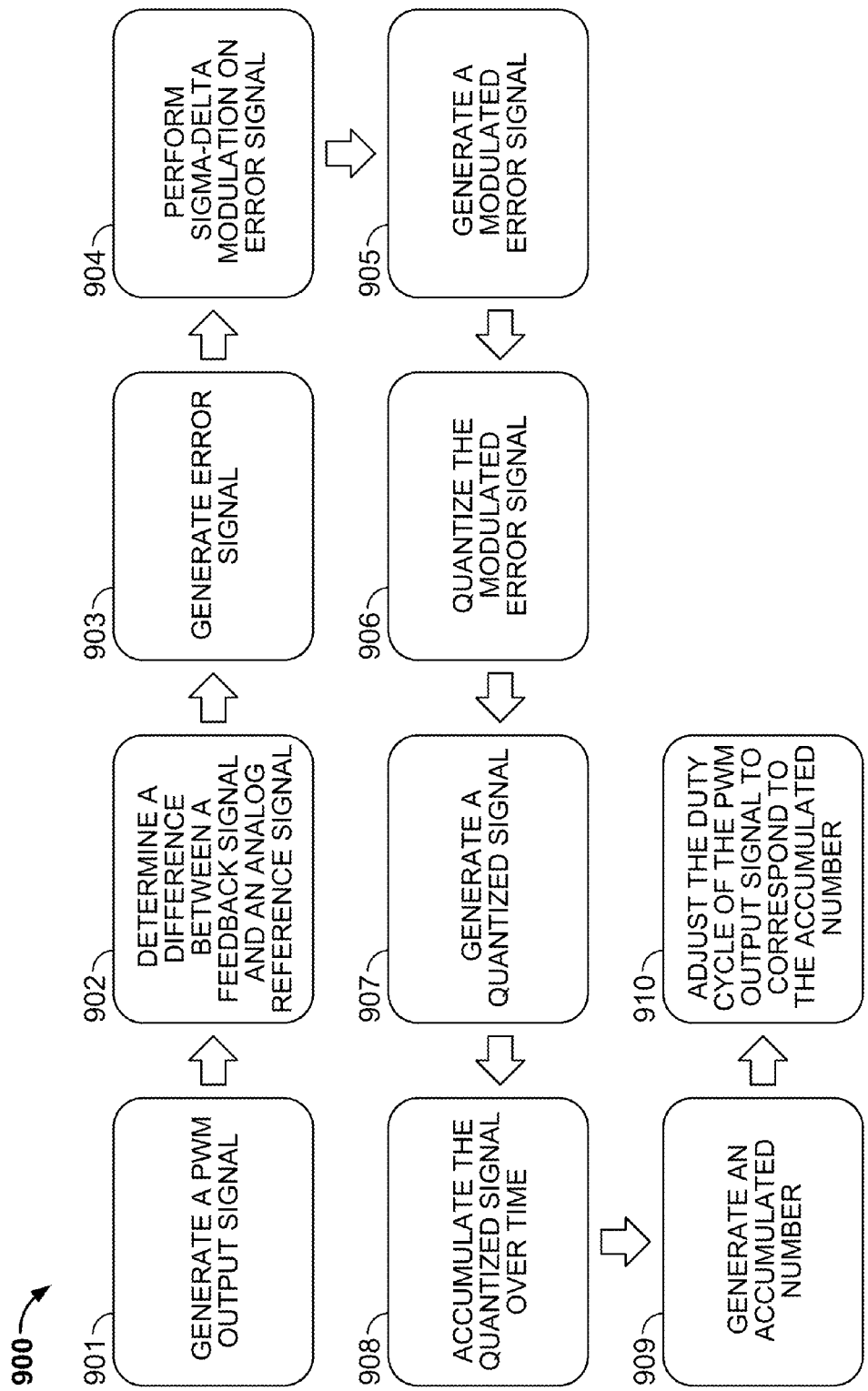
FIG. 9 is a flow chart of an example method performed by a control circuit.

FIG. 9 is a flow chart of an example method 900 performed by a control circuit.

The control circuit generates a PWM output signal (step 901). The control circuit determines the difference between a feedback signal and analog reference signal (step 902). The control circuit generates an error signal (step 903). The control circuit then performs sigma-delta modulation on the error signal 904 to generate a modulated error signal (step 904). The control circuit then quantizes the modulated error signal (step 906) to generate a quantized error signal (step 907). The control circuit then accumulates the quantized signal over time (step 908) to generate an accumulated number (step 909). The control circuit then adjusts the duty cycle of the PWM output signal to correspond to the accumulated number (step 910).

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A control circuit comprising:
a feedback input for receiving a feedback input signal;
a reference input for receiving an analog reference source;
a clock input for receiving a clock signal characterized by a clock frequency;
an analog processing component configured to compare the feedback input signal to the analog reference source and generate a quantized output signal, the analog processing component comprising:
a pre-processor circuit coupled to the feedback input and the analog reference source configured to generate a pre-processed signal;
a sigma-delta modulator coupled to the pre-processor circuit configured to receive the pre-processed signal and generate a quantized output signal;
a digital processing component coupled to the analog processing component, the digital processing component configured to generate a pulse width modulated (PWM) output signal characterized by a duty cycle and a PWM frequency using the quantized output signal, wherein the digital processing component is configured to generate the PWM output signal in a time less than two cycles of the PWM frequency from when the analog reference source receives the feedback input signal.

2. The control circuit of claim 1, wherein the digital processing component comprises:
a digital filter coupled to the sigma-delta modulator, the digital filter configured to adjust an accumulated value in response to the quantized output signal; and a finite state machine coupled to the clock input and also coupled to the digital filter, the finite state machine configured to divide the clock frequency, generate the PWM output signal, and set the duty cycle of the PWM output signal based on the accumulated value and clock signal.

3. The control circuit of claim 1, wherein the control circuit is configured to perform at least one of pulse skipping and period extension of the PWM output signal.

4. The control circuit of claim 1, wherein the sigma-delta modulator is configured to generate a modulated signal based on the pre-processed signal in a time less than a single PWM frequency cycle.

5. The control circuit of claim 1, wherein the control circuit is configured to keep the PWM frequency constant.

6. The control circuit of claim 1, wherein the analog processing component is configured to compare the feedback input to the analog reference source by using at least one of addition and subtraction of a measurement of the feedback input over time with the analog reference source.

7. The control circuit of claim 1, wherein the analog processing component is configured to compare the feedback input to the analog reference source by using at least one of addition and subtraction of a measurement of the change in the feedback input over time with the analog reference source.

8. The control circuit of claim 1, wherein the analog processing component is configured to compare the feedback input to the analog reference source by using at least one of addition and subtraction of a measurement of the feedback input over time multiplied by a first multiplier value, a measurement of the change in the feedback input over time multiplied by a second multiplier value, and the analog reference source.

9. The control circuit of claim 1, wherein the clock frequency is configured to be equal to the PWM frequency multiplied by a whole number greater than one.

10. The control circuit of claim 9, wherein the duty cycle is configured to be directly proportional to the quotient of the accumulated value divided by the whole number greater than one.

11. A control circuit comprising:
a feedback input for receiving a feedback input signal;
a reference input for receiving an analog reference source;
a clock input for receiving a clock signal characterized by a clock frequency;
an analog processing component configured to compare the feedback input signal to the analog reference source and generate a quantized output signal, the analog processing component comprising:
a pre-processor circuit coupled to the feedback input and the analog reference source configured to generate a pre-processed signal;
a sigma-delta modulator coupled to the pre-processor circuit configured to receive the pre-processed signal and generate a quantized output signal;
a digital processing component coupled to the analog processing component, the digital processing component configured to generate a pulse width modulated (PWM) output signal characterized by a duty cycle and a PWM frequency using the quantized output signal, wherein the control circuit is configured to perform at least one of pulse skipping and period extension of the PWM output signal and to limit to a maximum number how many consecutive cycles of the PWM output signal that at least one of pulse skipping and period extension can be performed on by:

counting a number of consecutive cycles of the PWM output signal on which at least one of pulse skipping and period extension is performed;
performing at least one of pulse skipping and period extension on a first cycle of the PWM output signal;
determining that at least one of pulse skipping and period extension need to be performed on a consecutive cycle; and
performing at least one of pulse skipping and period extension on the consecutive cycle only if the number of consecutive cycles is less than the maximum number.

12. A DC-DC converter circuit comprising:
a voltage input terminal configured to receive a source voltage;
a voltage output terminal configured to supply an output voltage to a load;
a switch coupled to the voltage input terminal;
a control circuit comprising:
a feedback input for receiving a feedback input signal, the feedback input coupled to the voltage output terminal;
a reference input for receiving an analog reference source;
a PWM output port coupled to the switch, the PWM output port configured to propagate a PWM output signal to open and close the switch, the PWM output signal being characterized by a duty cycle and a PWM frequency;
a clock input for receiving a clock signal characterized by a clock frequency;
an analog processing component configured to compare the feedback input signal to the analog reference source and generate a quantized output signal, the analog processing component comprising:
a pre-processor circuit coupled to the feedback input and the analog reference source, the pre-processor circuit configured to generate a pre-processed signal;
a sigma-delta modulator coupled to the pre-processor circuit, the sigma-delta modulator configured to receive the pre-processed signal and generate a quantized output signal;
a digital processing component coupled to the analog processing component, the digital processing component configured to generate the PWM output signal using the quantized output signal, wherein the digital processing component is configured to generate the PWM output signal in a time less than two cycles of the PWM frequency from when the analog reference source receives the feedback input signal.

13. The DC-DC converter circuit of claim 12, wherein the DC-DC converter circuit is a boost converter circuit comprising:
an inductor comprising two inductor terminals, the first inductor terminal coupled to the voltage input terminal;
at least one of a rectifier and a switch coupled between the inductor and the voltage output terminal; and
a capacitor coupled to the voltage output terminal.

14. The DC-DC converter circuit of claim 12, wherein the control circuit is configured to perform at least one of pulse skipping and period extension of the PWM output signal.

15. The DC-DC converter circuit of claim 12, wherein the sigma-delta modulator is configured to generate the modulated signal based on the pre-processed signal in a time less than a single PWM frequency cycle.

16. The DC-DC converter circuit of claim 12, wherein the control circuit is configured to keep the PWM frequency constant.

17. The DC-DC converter circuit of claim 12, wherein the analog processing component is configured to compare the feedback input to the analog reference source by using at least one of addition and subtraction of a measurement of the feedback input over time with the analog reference source.

18. The DC-DC converter circuit of claim 12, wherein the analog processing component is configured to compare the feedback input to the analog reference source by using at least one of addition and subtraction of a measurement of the change in the feedback input over time with the analog reference source.

19. The DC-DC converter circuit of claim 12, wherein the analog processing component is configured to compare the feedback input to the analog reference source by using at least one of addition and subtraction of a measurement of the feedback input over time multiplied by a first multiplier value, a measurement of the change in the feedback input over time multiplied by a second multiplier value, and the analog reference source.

20. The DC-DC converter circuit of claim 12, wherein the clock frequency is configured to be equal to the PWM frequency multiplied by a whole number greater than one.

21. The DC-DC converter circuit of claim 20, wherein the duty cycle is configured to be directly proportional to the quotient of the accumulated value divided by the whole number greater than one.

22. A DC-DC converter circuit comprising:
a voltage input terminal configured to receive a source voltage;
a voltage output terminal configured to supply an output voltage to a load;
a switch coupled to the voltage input terminal;
a control circuit comprising:
a feedback input for receiving a feedback input signal, the feedback input coupled to the voltage output terminal;
a reference input for receiving an analog reference source;
a PWM output port coupled to the switch, the PWM output port configured to propagate a PWM output signal to open and close the switch, the PWM output signal being characterized by a duty cycle and a PWM frequency;
a clock input for receiving a clock signal characterized by a clock frequency;
an analog processing component configured to compare the feedback input signal to the analog reference source and generate a quantized output signal, the analog processing component comprising:
a pre-processor circuit coupled to the feedback input and the analog reference source, the pre-processor circuit configured to generate a pre-processed signal;
a sigma-delta modulator coupled to the pre-processor circuit, the sigma-delta modulator configured to receive the pre-processed signal and generate a quantized output signal;
a digital processing component coupled to the analog processing component, the digital processing component configured to generate the PWM output signal using the quantized output signal, wherein the control circuit is configured to perform at least one of pulse skipping and period extension of the PWM output signal and to limit a maximum number how many consecutive cycles of the PWM output signal that at least one of pulse skipping and period extension can be performed on by:
counting a number of consecutive cycles of the PWM on which at least one of pulse skipping and period extension is performed;
performing at least one of pulse skipping and period extension on a first cycle of the PWM output signal;
determining that at least one of pulse skipping and period extension need to be performed on a consecutive cycle; and
performing at least one of pulse skipping and period extension on the consecutive cycle only if the number consecutive cycles is less than the maximum number.

23. A method performed by a control circuit, the method comprising:
generating a PWM output signal;
determining a difference between a feedback signal and an analog reference source to generate an error signal;
performing sigma-delta modulation on the error signal to generate a modulated error signal;
quantizing the modulated error signal to generate a quantized signal;
accumulating the quantized signal over time to generate an accumulated number;
adjusting a duty cycle of the PWM output signal to correspond to the accumulated number, thereby causing the duty cycle to be a certain duty cycle whenever the accumulated number is a specific number, wherein adjusting the duty cycle comprises adjusting the duty cycle within two cycles of the PWM output signal from the start of determining the difference.

24. The method of claim 23, further comprising performing at least one of pulse skipping and period extension of the PWM output signal.

25. The method of claim 23, wherein the control circuit quantizes the modulated error signal within one cycle of the PWM output signal from the start of generating the modulated error signal.

26. The method of claim 23, further comprising maintaining the PWM output signal at a frequency that is constant.

27. The method of claim 23, wherein determining the difference comprises at least one of addition and subtraction of a measurement of the feedback signal over time with the analog reference source.

28. The method of claim 23, wherein determining the difference comprises at least one of addition and subtraction of a measurement of the change in the feedback signal over time with the analog reference source.

29. The method of claim 23, wherein determining the difference comprises at least one of addition and subtraction of a measurement of the feedback signal over time multiplied by a first multiplier value, a measurement of the change in the feedback signal over time multiplied by a second multiplier value, and the analog reference source.

30. A method performed by a control circuit, the method comprising:
generating a PWM output signal;
determining a difference between a feedback signal and an analog reference source to generate an error signal;
performing sigma-delta modulation on the error signal to generate a modulated error signal;
quantizing the modulated error signal to generate a quantized signal;
accumulating the quantized signal over time to generate an accumulated number;

adjusting a duty cycle of the PWM output signal to correspond to the accumulated number, thereby causing the duty cycle to be a certain duty cycle whenever the accumulated number is a specific number; and performing at least one of pulse skipping and period extension of the PWM output signal and limiting the number of consecutive duty cycles of the PWM output signal that at least one of pulse skipping and period extension can be performed to a maximum number by:

counting a number of consecutive cycles of the PWM output signal on which at least one of pulse skipping and period extension is performed;

performing at least one of pulse skipping and period extension on a first cycle of the PWM output signal;

determining that at least one of pulse skipping and period extension need to be performed on a consecutive cycle; and performing at least one of pulse skipping and period extension on the consecutive cycle only if the number of times is less than the maximum number.

* * * * *